United States Patent
Kim et al.

(10) Patent No.: US 8,344,308 B2
(45) Date of Patent: Jan. 1, 2013

(54) IMAGE READER AND IMAGE FORMING APPARATUS HAVING A RESTRICTING MEMBER FOR RESTRICTING DEFORMATION OF A SUBSTRATE

(75) Inventors: Dal Yong Kim, Incheon (KR); Hironori Shimada, Kanagawa (JP)

(73) Assignee: Fuji Xerox Co., Ltd., Tokyo (JP)

(*) Notice: Subject to any disclaimer, the term of this patent is extended or adjusted under 35 U.S.C. 154(b) by 353 days.

(21) Appl. No.: 12/830,703

(22) Filed: Jul. 6, 2010

(65) Prior Publication Data
US 2011/0095168 A1 Apr. 28, 2011

(30) Foreign Application Priority Data
Oct. 22, 2009 (JP) ................. 2009-243849

(51) Int. Cl.
*H01L 27/00* (2006.01)
(52) U.S. Cl. .................. 250/208.1; 250/239
(58) Field of Classification Search .......... 250/208.1, 250/239, 214 R, 221; 358/471–475, 482, 358/483, 493–498
See application file for complete search history.

(56) References Cited

U.S. PATENT DOCUMENTS
5,254,847 A * 10/1993 Hata et al. .................. 250/208.1

FOREIGN PATENT DOCUMENTS
JP A-2007-81776 3/2007

* cited by examiner

*Primary Examiner* — Que T Le
(74) *Attorney, Agent, or Firm* — Oliff & Berridge, PLC

(57) ABSTRACT

An image reader includes: a rectangular substrate; a photoelectric conversion element that is mounted on one surface of the substrate; a connector that is mounted on the other surface of the substrate so as to be closer to one end face of the substrate than a position on the substrate where the photoelectric conversion element is mounted, and is connected to a signal line; a support member; and a restricting member that is provided on the substrate so as to be closer to the one end face of the substrate in the longitudinal direction than the position where the substrate is supported by the support member, when another connector is fitted to at least the connector, the restricting member coming into contact with the one surface of the substrate and restricting the deformation of the substrate in a direction in which the another connector is fitted.

6 Claims, 6 Drawing Sheets

IMAGE READER AND IMAGE FORMING APPARATUS HAVING A RESTRICTING MEMBER FOR RESTRICTING DEFORMATION OF A SUBSTRATE

CROSS-REFERENCE TO RELATED APPLICATIONS

This application is based on and claims priority under 35 USC 119 from Japanese Patent Application No. 2009-243849 filed Oct. 22, 2009.

BACKGROUND

Technical Field

The invention relates to an image reader and an image forming apparatus.

SUMMARY

According to an aspect of the invention, there is provided an image reader including: a rectangular substrate; a photoelectric conversion element that is mounted on one surface of the substrate and receives light reflected from a document; a connector that is mounted on the other surface of the substrate so as to be closer to one end face of the substrate than a position on the substrate where the photoelectric conversion element is mounted, and is connected to a signal line through which information on an electrical signal converted by the photoelectric conversion element is sent; a support member that supports the substrate at a position closer to the other end face of the substrate than the connector in a longitudinal direction of the substrate; and a restricting member that is provided on the substrate so as to be closer to the one end face of the substrate in the longitudinal direction than the position where the substrate is supported by the support member, when another connector is fitted to the connector, the restricting member coming into contact with the one surface of the substrate and restricting the deformation of the substrate in a direction in which the another connector is fitted.

BRIEF DESCRIPTION OF THE DRAWINGS

Exemplary embodiments of the present invention will be described in detail based on the following figures, wherein:

FIGS. 6A and 6B show the vicinity of a connector of the image reading unit of the exemplary embodiment of the invention, in which FIG. 6A is a partially enlarged view showing that the connector is not fitted yet, and FIG. 6B is a partially enlarged view showing that the connector is fitted.

DETAILED DESCRIPTION

First Exemplary Embodiment (The Entire Structure of Image Forming Apparatus)

Figure 1:
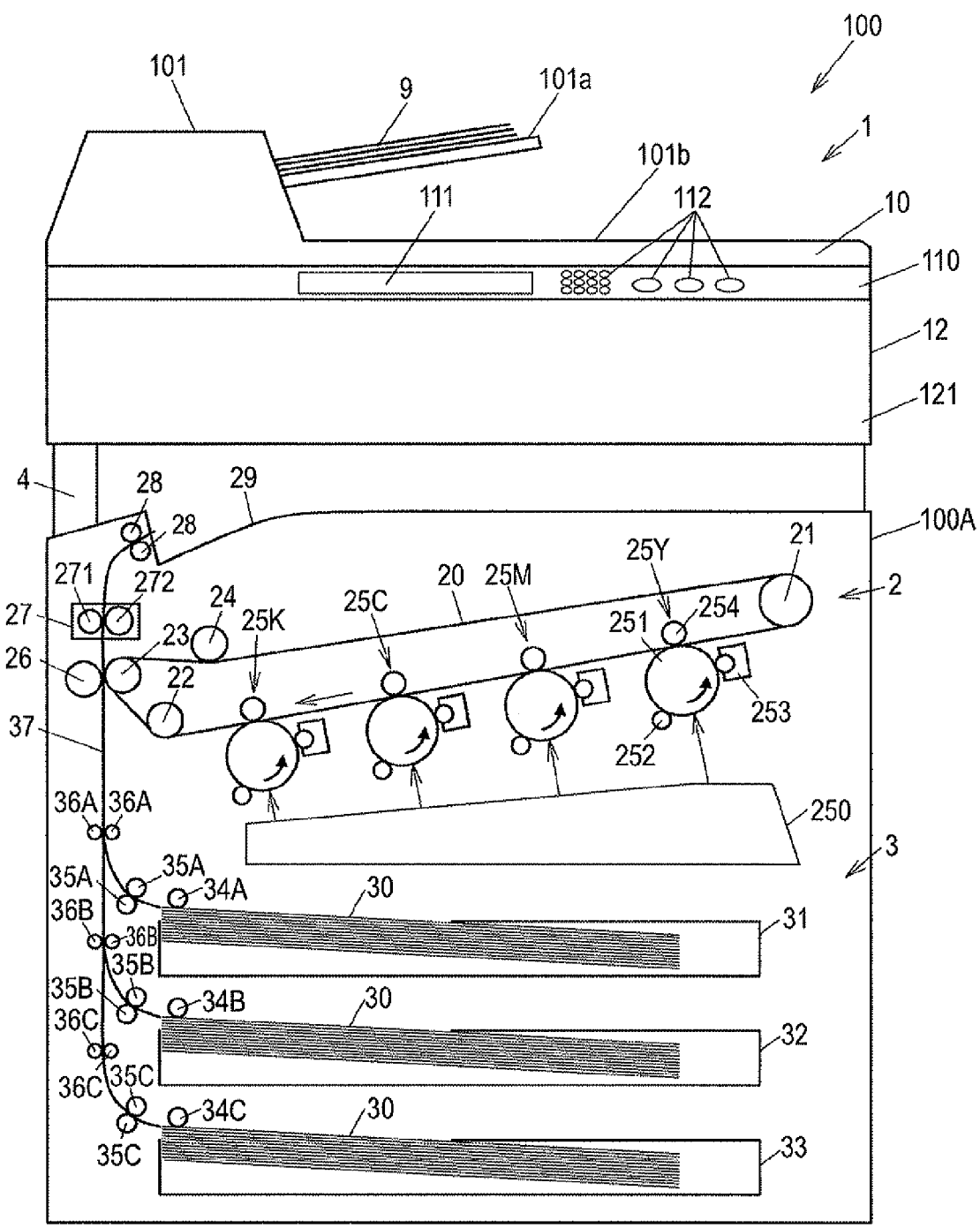
FIG. 1 is a diagram showing an entire image forming apparatus according to an exemplary embodiment of the invention.

FIG. 1 shows an image forming apparatus according to a first exemplary embodiment of the invention. FIG. 1 shows the appearance of an image reader 1 and the internal structure of a main body portion 100A that is disposed below the image reader 1.

The image forming apparatus 100 includes an image reader 1 that reads images from a document 9, an image forming section 2 that prints images on a sheet 30 as a recording medium, and a tray section 3 that feeds a sheet to the image forming section 2. The image reader 1 is supported above the main body portion 100A by a supporting portion 4 so that a space to which a printed sheet is discharged is formed between the image reader and the main body portion 100A receiving the image forming section 2 and the tray section 3.

A touch panel 111, which provides operation menus to a user and receives various settings, and a control panel 110 including plural operation buttons 112 are provided on a front wall 121 that corresponds to a front surface of a housing 12 of the image reader 1. Further, a document cover 10, which can be opened and closed relative to the housing 12, is disposed on the control panel 110. The document cover 10 is provided with an automatic sheet feeder 101. The automatic sheet feeder transports the document 9, which is placed on a sheet feed tray 101a, to a reading position and discharges the read document 9 to a sheet ejection table 101b.

The image forming section 2 includes an intermediate transfer belt 20; first to fourth image forming units 25Y, 25M, 25C, and 25K that transfer yellow (Y), magenta (M), cyan (C), and black (K) toner images to the intermediate transfer belt 20; and an optical scanning device 250 that irradiates the first to fourth image forming units 25Y, 25M, 25C, and 25K with laser light modulated on the basis of image information.

The first image forming unit 25Y includes a photoconductive drum 251, a charger 252, a developing unit 253, and a primary transfer roller 254. The charger 252 uniformly charges the surface of the photoconductive drum 251. The developing unit 253 forms a toner image by developing an electrostatic latent image that is formed with toner on the surface of the photoconductive drum 251 by the optical scanning device 250. The primary transfer roller 254 presses the intermediate transfer belt 20 against the photoconductive drum 251. Each of the second to fourth image forming units 25M, 25C, and 25K also has the same structure as that of the first image forming unit 25Y.

The intermediate transfer belt 20 is driven by a driving roller 21 connected to a motor (not shown), and is rotated along a circulation path that is formed by first and second driven rollers 22 and 23 and a tension roller 24 applying tension to the intermediate transfer belt 20.

Further, the image forming section 2 includes a secondary transfer roller 26, a fixing unit 27, and discharge rollers 28. The secondary transfer roller 26 is disposed at a position that faces the second driven roller 23 with the intermediate transfer belt 20 interposed therebetween. The fixing unit 27 includes a fixing roller 271 where a heater is built, and a pressing roller 272 that is pressed against the fixing roller 271. The discharge rollers 28 discharge a sheet, which has passed through the fixing unit 27, to a discharge table 29.

The tray section 3 includes first to third trays 31 to 33 that are disposed parallel to each other in a vertical direction. Sheets 30, which have different orientations, sizes, or materials, are stored in the respective first to third trays.

Further, the tray section 3 includes pickup rollers 34A, 34B, and 34C; separation rollers 35A, 35B, and 35C; and registration rollers 36A, 36B, and 36C so as to correspond to the first to third trays 31 to 33, respectively. Each of the pickup rollers 34A, 34B, and 34C picks up the stored sheet 30. When plural sheets 30 are picked up, each of the separation rollers 35A, 35B, and 35C separates the sheets. Each of the registration rollers 36A, 36B, and 36C transports the sheet 30 to the downstream side. The registration rollers 36A, 36B, and 36C are operated in synchronization with the timing of the image formation that is performed by the image forming section 2, and guide the sheets 30, which are picked up from the first to third trays 31 to 33, to a gap between the secondary transfer roller 26 and the intermediate transfer belt 20 along a transport path 37.

The image forming apparatus 100 is adapted as follows: when the sheets 30 having different sizes or orientations are stored in the respective trays 31 to 33, the sheet 30 fed from each of the trays 31 to 33 is transported so that the middle of the sheet 30 corresponds to the middle of the transport path 37, and is discharged onto the discharge table 29 from the discharge rollers 28.

(Structure of Image Reader)

Figure 2:
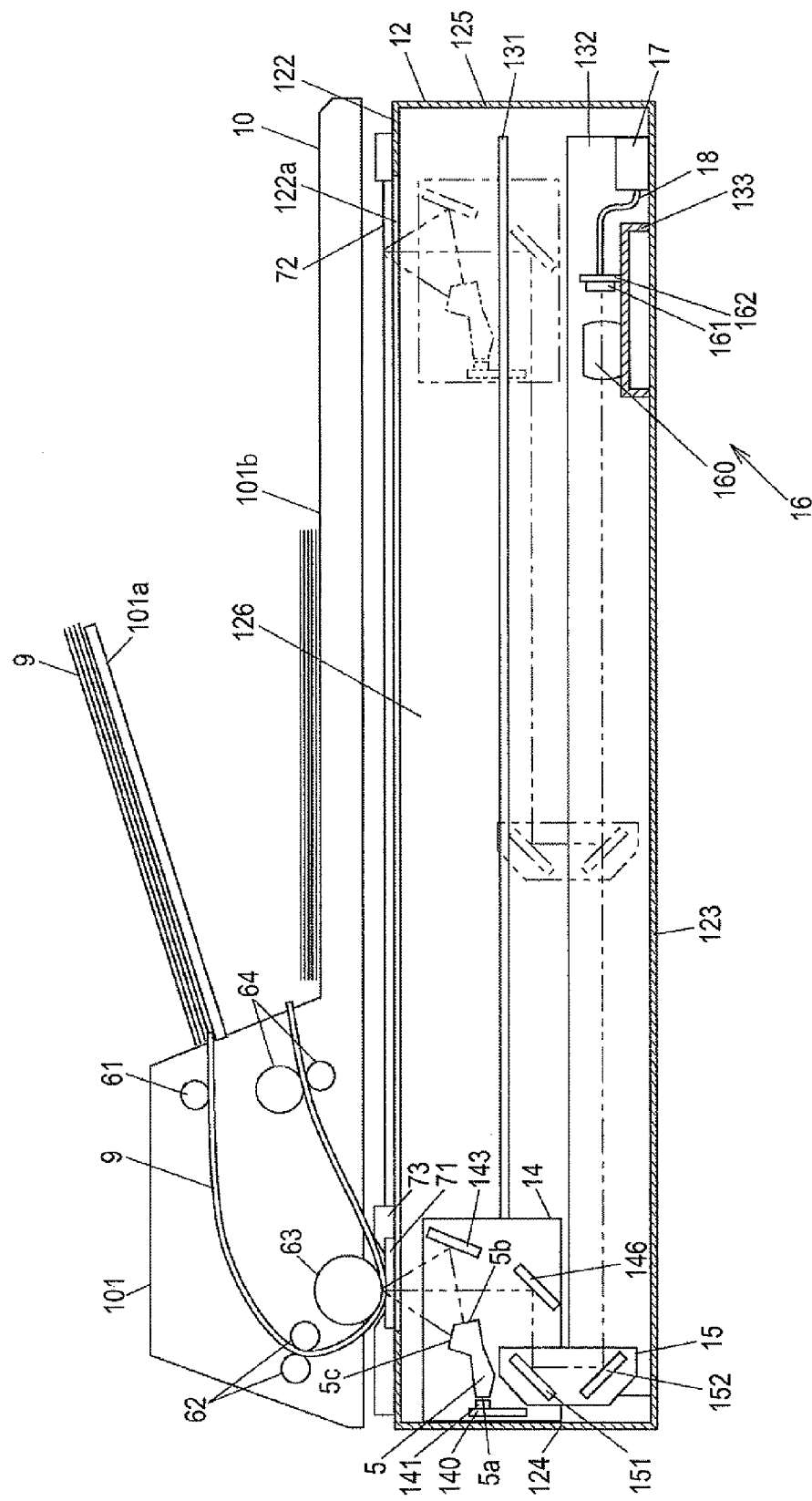
FIG. 2 is a schematic diagram showing an internal structure of an image reader according to the exemplary embodiment of the invention.

FIG. 2 is a schematic view showing the internal structure of the image reader 1. The image reader 1 can switch a mode between first and second reading modes according to the operation of a user. In the first reading mode, documents 9 placed on the sheet feed tray 101a of the automatic sheet feeder 101 are read while being transported to the sheet ejection table 101b. In the second reading mode, one document placed on a document table 72 is read. FIG. 2 shows that a document is read in the first reading mode.

The automatic sheet feeder 101, which is provided at the document cover 10, includes a document transport mechanism that includes a document feed roller 61, document transport rollers 62, a reading roller 63, and discharge rollers 64. The document feed roller 61 takes one of the documents 9 placed on the sheet feed tray 101a. The document transport rollers 62 transport the document 9, which is taken by the document feed roller 61, to the read position. The reading roller 63 supports the document 9, which is transported by the document transport rollers 62, at the read position. The discharge rollers 64 discharge the document 9 to the sheet ejection table 101b.

The image reader 1 includes first and second carriages 14 and 15, an image reading unit 16, and a controller 17 in the housing 12. The first and second carriages 14 and 15 are disposed in a main scanning direction, and can move in a sub-scanning direction. The image reading unit 16 outputs image data. The controller 17 controls the image reader 1.

The housing 12 is formed in the shape of a box of which a part of an upper wall 122 facing the document cover 10 is opened. The housing 12 includes a bottom wall 123 that faces the upper wall 122, side walls 124 and 125 that face each other in the sub-scanning direction (a horizontal direction in FIG. 2) with the bottom wall 123 interposed therebetween, the above-mentioned front wall 121 (see FIG. 1), and a rear wall 126 that faces the front wall 121 in the main scanning direction (a direction perpendicular to the plane of FIG. 2).

An opening 122a is formed at a portion of the upper wall 122 that corresponds to the read position of the document 9. The document table 72, which is made of platen glass and supports the document 9 in the second reading mode, is disposed at the opening 122a. Further, a read window 71, which is made of platen glass and allows the document 9 to be read in the first reading mode, is provided at a portion of the document table 72 that corresponds to the automatic sheet feeder 101. A guide 73, which guides the document 9 in the first reading mode, is provided between the read window 71 and the document table 72.

First rails 131, which extend in the sub-scanning direction, are fixed to the rear wall 126. Further, second rails 132, which extend in the sub-scanning direction, are fixed to the bottom wall 123. Two first rails 131 and two second rails 132 are disposed parallel to each other in the main scanning direction, but only one of each of the rails is shown in FIG. 2.

A substrate 140, LEDs 141, a light guide body 5, a reflector 143, and a first mirror 146 are fixed to the first carriage 14. The substrate 140 extends along the first carriage 14 in the main scanning direction. The LEDs 141 are mounted on the substrate 140, and function as light emitting elements emitting light that is used to irradiate the document 9. The light guide body 5 extends along the first carriage 14 in the main scanning direction, and is disposed parallel to the substrate 140. The reflector 143 functions as a reflecting member for reflecting a part of the light, which is emitted from the light guide body 5, toward the document 9. The first mirror 146 receives the light reflected from the document 9. Plural LEDs 141 are mounted on the substrate 140 in the main scanning direction. The plural LEDs 141 form a light source as a whole.

The first carriage 14 is guided by the first rails 131, irradiates a portion of the document 9 where an image is read while moving in the sub-scanning direction together with members such as the light guide body 5, and reflects the light, which is reflected from the document 9, by the first mirror 146 toward a second mirror 151 of the second carriage 15 to be described below.

The light guide body 5 is made of an optically transparent material such as a polymethyl methacrylate resin, and has the shape of a rod. The light guide body includes an incident surface 5a, a first emission surface 5b, and a second emission surface 5c. The light emitted from the LEDs 141 enters the incident surface 5a. The first emission surface 5b emits a part of the light, which enters from the incident surface 5a, toward the reflector 143. The second emission surface 5c emits the other part of the light, which enters from the incident surface 5a, toward the document 9.

Second and third mirrors 151 and 152 are fixed to the second carriage 15. The second mirror 151 receives the light reflected from the above-mentioned first mirror 146, and the third mirror 152 receives the light reflected from the second mirror 151.

Further, the second carriage 15 is guided by the second rails 132, and reflects the light, which is reflected from the document 9, toward an imaging lens 160 of the image reading unit 16 while moving in the sub-scanning direction. The first mirror 146, the second mirror 151, and the third mirror 152 form an optical system for guiding the light, which is reflected from the document 9, toward the image reading unit 16.

In the second reading mode, the first and second carriages 14 and 15 are driven by a drive mechanism (not shown), and the moving distance of the second carriage 15 is equal to the half of the moving distance of the first carriage 14 so that the length of an optical path between a CCD 161 to be described below and the portion of the document 9 where an image is read is not changed, while the first carriage 14 moves in the sub-scanning direction. The first and second carriages 14 and 15, when the first carriage 14 is moved near the end of the document 9 in the sub-scanning direction, are shown in FIG. 2 by a two-dot chain line.

The image reading unit 16 includes a base plate 133 that is fixed to the second rails 132 and the bottom wall 123. The image reading unit includes an imaging lens 160 that is fixed to the base plate 133, a plate-like substrate 162 that is disposed on the side of an emission surface of the imaging lens 160, a CCD (Charge Coupled Device) 161 that functions as a photoelectric conversion element and is mounted on the substrate 162, and the like.

Further, the image reading unit 16 has functions to form an image on the CCD 161 by the light that is reflected from the third mirror 152 and transmitted through the imaging lens 160, to read the image of the document 9 by the CCD 161, and to output the information on the image.

For example, a material that is obtained by solidifying a glass fiber with an epoxy resin, Bakelite, or the like is used as a base material of the substrate 162, and the substrate has flexibility that allows the substrate to be bent in a thickness direction thereof by an external force and elasticity that allows the substrate to return to the original shape when the external force is removed.

The controller 17 is connected to the substrate 162 of the image reading unit 16 by a cable 18 that includes an electric wire including a signal line used to send the information on the image read by the CCD 161. The controller 17 sends the information on the image, which is sent from the image reading unit 16 during the reading of the document 9, to the image forming section 2.

(Structure of Substrate)

Figure 3:
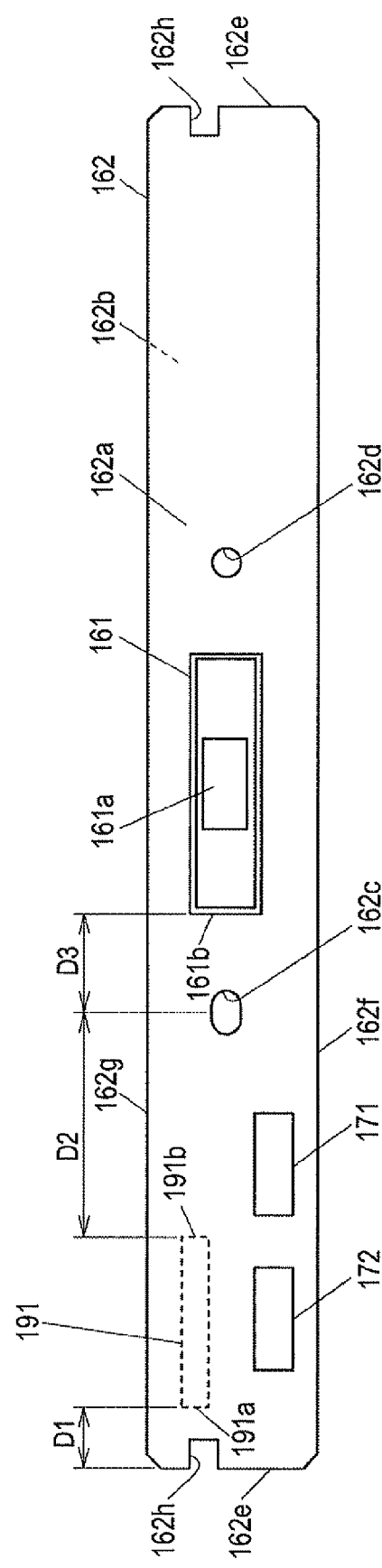
FIG. 3 is a side view of a substrate according to the exemplary embodiment of the invention.

FIG. 3 is a side view of the substrate 162 when seen from a surface 162a of the substrate on which the CCD 161 is mounted.

The substrate 162 is disposed so as to extend in the main scanning direction, and the CCD 161 is mounted on the surface 162a of the substrate in the middle of the substrate in a longitudinal direction of the substrate.

A mounting hole 162c is formed at the substrate on one side (the side corresponding to the rear wall 126 in FIG. 2) of the portion of the substrate 162, where the CCD 161 is mounted, in the longitudinal direction, and a mounting hole 162d is formed at the substrate on the other side (the side corresponding to the front wall 121) thereof. Further, recesses 162h, which are recessed toward the middle of the substrate in the longitudinal direction, are formed on both end faces 162e of the substrate 162 in the longitudinal direction, at positions that are closer to an upper end face 162g of the substrate than a lower end face 162f thereof in the height direction of the substrate.

A first connector 191 is mounted on a back surface 162b of the substrate 162 at a position between the mounting hole 162c and one end face 162e in the longitudinal direction.

A distance D1 between one end face 162e of the substrate 162 and one end face 191a of the first connector 191 in the longitudinal direction of the substrate 162 is shorter than a distance D2 between the center of the mounting hole 162c and the other end face 191b of the first connector 191 in the longitudinal direction of the substrate 162.

Further, a distance D3 between one end face 161b of the CCD 161 in the longitudinal direction of the substrate 162 and the center of the mounting hole 162c in the longitudinal direction of the substrate 162 is shorter than the above-mentioned distance D2.

Furthermore, electronic components, such as an AD conversion element 171 and a communication element 172, are mounted on the substrate 162. The AD conversion element 171 converts an image signal, which is output from the CCD 161, into a digital signal. The communication element 172 sends an output signal of the AD conversion element 171. The CCD 161, the AD conversion element 171, the communication element 172, and the first connector 190 are connected to one another by wiring (not shown) formed on the substrate 162.

(Structure of Image Reading Unit)

Figure 4:
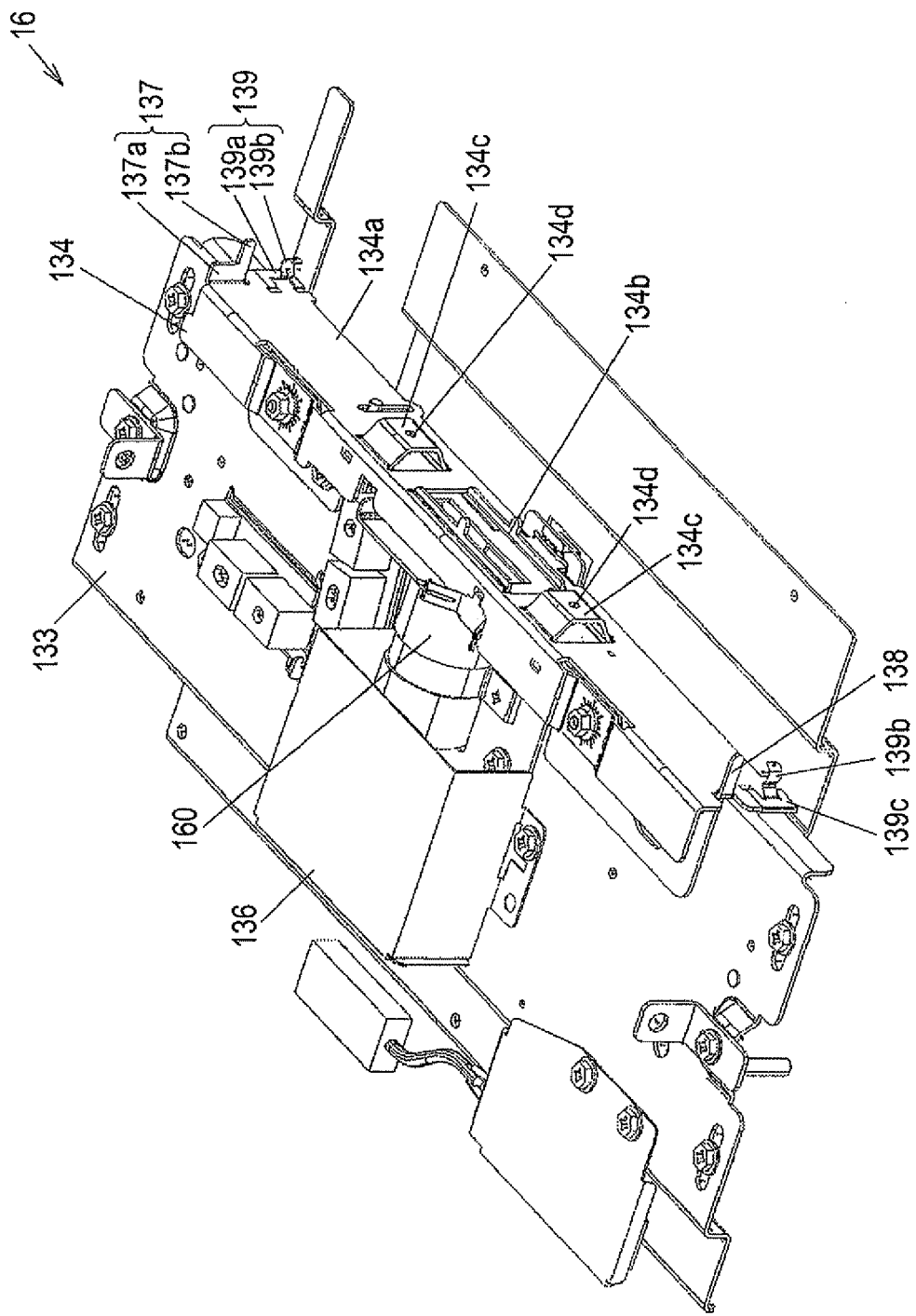
FIG. 4 is a perspective view showing the structure of an image reading unit according to the exemplary embodiment of the invention.

FIG. 4 is a perspective view showing the structure of the image reading unit 16 where the substrate 162 is not mounted yet.

The image reading unit 16 includes the above-mentioned base plate 133, a support member 134 that is fixed to the base plate 133, a restricting member 137 that is fixed to the support member 134, a suspension member 138, elastic support members 139, and a cover 136 that covers the upper portion of the incident surface of the imaging lens 160. Each of the base plate 133, the support member 134, the restricting member 137, and the suspension member 138 is formed of a conductive metal plate such as a galvanized steel plate, and is connected to the ground.

The base plate 133 is disposed in the housing 12 so as to be parallel to the document table 72. Further, the imaging lens 160 is fixed to the base plate 133.

The support member 134 is formed so as to extend in the main scanning direction, and is fixed to the base plate 133 so that an opposite surface 134a of the support member facing the surface 162a of the substrate 162 is perpendicular to the base plate 133.

Further, a window portion 134b, which is opened in a rectangular shape, is formed in the middle of the support member 134 in the longitudinal direction of the support member. Two protruding portions 134c, which protrude toward the side opposite to the imaging lens 160, are formed on both sides of the window portion 134b in the longitudinal direction. A screw hole 134d having threads is formed at the flat surface of the end portion of each of the protruding portions 134c.

The restricting member 137 is fixed to the back side of the support member 134 (which corresponds to the rear wall 126) in the longitudinal direction of the support member. The restricting member 137 includes a contact portion 137a that protrudes from the opposite surface 134a of the support member 134 in the sub-scanning direction, and a suspension portion 137b that further protrudes from the contact portion 137a in the sub-scanning direction.

The suspension member 138 is fixed to the front side of the support member 134 (which corresponds to the front wall 121) in the longitudinal direction of the support member. Further, the end portion of the suspension member 138 protrudes from the opposite surface 134a of the support member 134 in the sub-scanning direction, and the shape of the end portion is the same as that of the suspension portion 137b of the restricting member 137.

The elastic support members 139 are fixed to both ends of the opposite surface 134a of the support member 134 in the longitudinal direction below the restricting member 137 and the suspension member 138. Each of the elastic support members 139 includes an elastically deformable protrusion 139b that extends from a base 139a fixed to the opposite surface 134a so as to be perpendicular to the opposite surface 134a. The end portion of each of the protrusions 139b is curved to form a semicircular shape toward the middle of the support member 134 in the main scanning direction.

Figure 5:
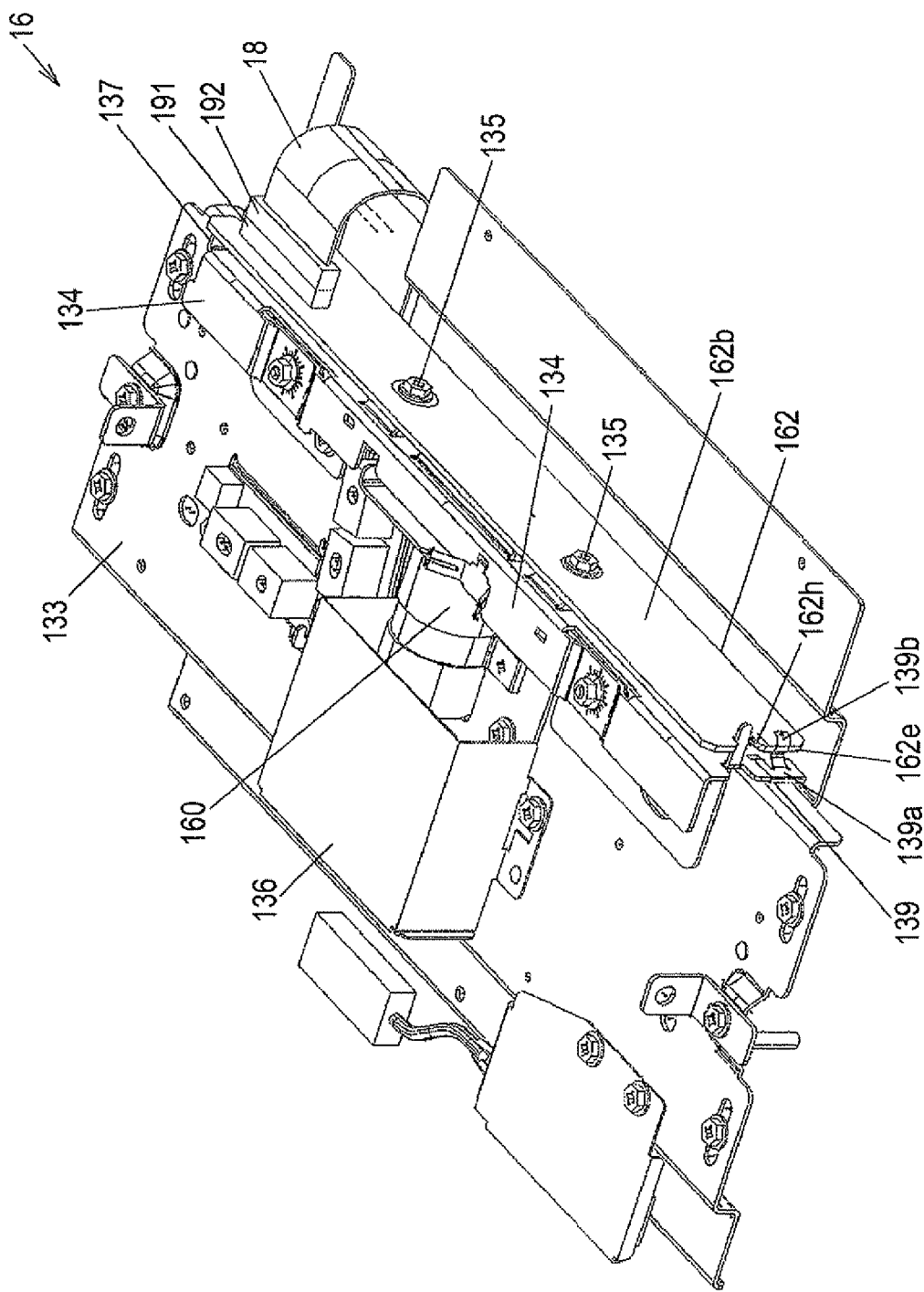
FIG. 5 is a perspective view showing the structure of an image reading unit according to the exemplary embodiment of the invention.

FIG. 5 is a perspective view showing that the substrate 162 is fixed to the support member 134. The substrate 162 is fixed to the window portion 134a at a position corresponding to the CCD 161 so that the light emitted from the imaging lens 160 forms an image on a light receiving surface 161a of the CCD 161. The substrate 162 is fixed to the support member 134 on the front side of the first connector 191 by two bolts 135 that pass through the mounting holes 162c and 162d from the back surface 162b of the substrate 162 and are tightened to the screw holes 134d of the support member 134.

The surface 162a of the substrate 162 faces the contact portion 137a of the restricting member 137 with a space therebetween. Further, the end faces 162e of the substrate 162 are held by the protrusions 139b of the elastic support members 139, so that vibration is suppressed at the ends of the substrate 162.

Moreover, the suspension portion 137b of the restricting member 137 and the suspension member 138 are fitted to the recesses 162h of both ends of the substrate 162, respectively.

A second connector 192 is connected to one end of the cable 18 that corresponds to the substrate 162. The second connector 192 is fitted to the first connector 191 mounted on the substrate 162, so that metal terminals (not shown) of the connectors come into contact with each other. As a result, it may be possible to achieve electrical conduction. Meanwhile, the other end of the cable 18 is connected to the above-mentioned controller 17.

(Method of Assembling Image Reading Unit)

The fixing of the substrate 162 to the support member 134 of the image reading unit 16 and the fitting of the first connector 191 to the second connector 192 are performed as follows:

A worker, who assembles the image reading unit 16, fits the suspension portion 137b of the restricting member 137 and the suspension member 138 to the recesses 162h of both ends of the substrate 162 so that the CCD 161 faces the window portion 134b of the support member 134 and the surface 126a of the substrate 162 faces the opposite surface 134a of the support member 134.

Then, the worker fits both end faces 162e of the substrate 162 to the curved portions of the protrusions 139b of the elastic support members 139. In this state, the mounting holes 162c and 162d of the substrate 162 are positioned so as to correspond to the screw holes 134d that are formed at the protruding portions 134c of the support member 134.

After that, the worker makes the threaded portions of two bolts 135 pass through the mounting holes 162c and 162d of the substrate 162, and tightens the two bolts to the screw holes 134d. Accordingly, the substrate 162 is fixed to the support member 134.

Then, the worker fits the second connector 192, which is connected to the cable 18, to the first connector 191 that is mounted on the back surface 162b of the substrate 162.

Figure 6A:
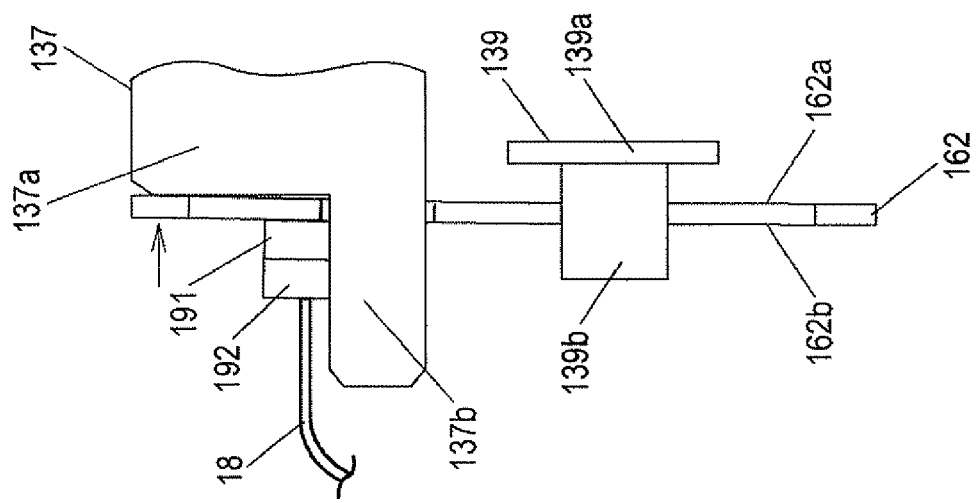
Figure 6B:
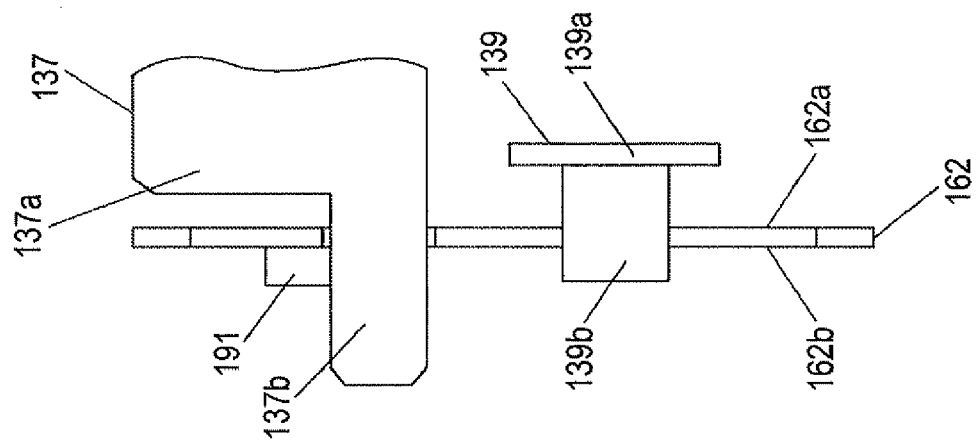

FIGS. 6A and 6B show the first connector 191 and the vicinity of the first connector when seen from the back side in the main scanning direction. When the second connector 192 is not fitted to the first connector 191 yet (see FIG. 6A), a space is formed between the surface 162a of the substrate 162 and the contact portion 137a of the restricting member 137. A distance between the surface 162a of the substrate 162 and the contact portion 137a of the restricting member 137 is, for example, 0.5 mm.

Meanwhile, when the second connector 192 is fitted to the first connector 191 (see FIG. 6B), the first connector 191 is pressed against the second connector 192. Accordingly, the substrate 162 is elastically deformed and the surface 162a of the substrate 162 comes into contact with the contact portion 137a of the restricting member 137. Since the substrate 162 and the restricting member 137 come into contact with each other, further deformation of the substrate 162 is restricted.

After the second connector 192 is fitted to the first connector 191, the substrate 162 returns to the original shape and the substrate 162 is separated from the contact portion 137a of the restricting member 137. Accordingly, the substrate 162 and the restricting member 137 are always separated from each other during the operation of the image reader 1. As a result, it may be possible to avoid change in the condition of the electromagnetic waves emitted from the substrate 162 or change in the degree of influence of the electromagnetic waves, which are emitted from the outside, on the operation of the electronic components of the substrate 162, according to whether the substrate 162 and the restricting member 137 come into contact with each other.

(Operation of Image Forming Apparatus)

When a user places a document 9 on the sheet feed tray 101a or the document table 72 and instructs the image forming apparatus to copy the document by operating the operation buttons 112 and the touch panel 111 of the control panel 110, the image reader 1 begins to read images. If the first reading mode is selected, the controller 17 of the image reader 1 controls the automatic sheet feeder 101 so that the document 9 is transported to a reading target area 74 of the read window 71.

The controller 17 of the image reader 1 makes the plural LEDs emit light by supplying current to the plural LEDs 141. The light emitted from light emitting surfaces 141a of the LEDs 141 enters the incident surface 5a of the light guide body 5, and is emitted from the first and second emission surfaces 5b and 5c of the light guide body 5.

Further, the controller 17 of the image reader 1 controls the drive mechanism so that the first and second carriages 14 and 15 are driven in the sub-scanning direction. In the first reading mode, the first carriage 14 is fixed at a position where emitted light is transmitted through the read window 71. In the second reading mode, the first carriage 14 moves so as to scan the document 9 placed on the document table 72 in the sub-scanning direction.

The light emitted from the first emission surface 5b is reflected by the reflector 143 and is irradiated to the document 9. The light emitted from the second emission surface 5c is directly irradiated to the document 9.

The light, which is reflected from the surface 9a of the document 9 positioned in the reading target area 74, is reflected by the first mirror 146, the second mirror 151, and the third mirror 152, and enters the imaging lens 160 of the image reading unit 16.

The light, which is transmitted through the imaging lens 160, forms an image on the light receiving surface 161a of the CCD 161. The CCD 161 photoelectrically converts the brightness of the light, which forms an image, into the amount of charge by plural pixels that are disposed on the light receiving surface 161a, sequentially reads the amount of charge, converts the amount of charge into electrical signals, and outputs the electrical signals. The electrical signal is converted from an analog signal into a digital signal by the AD conversion element 171, and is sent to the controller 17 through the connector 19 and the cable 18 by the communication element 172.

The controller 17 sends the information on the image, which is sent from the image reading unit 16, to the optical scanning device 250 of the image forming section 2. After that, when having read the document 9 placed on the sheet feed tray 101a, the controller 17 controls the automatic sheet feeder 101 so that the document 9 is discharged to the sheet ejection table 101b.

The optical scanning device 250 forms electrostatic latent images on the surfaces of the photoconductive drums 251 by irradiating the photoconductive drums 251, which are charged by the chargers 252, with yellow, magenta, cyan, and black lights that are modulated on the basis of the information on the image sent from the image reading unit 16. The electrostatic latent images are developed with toner by the developing units 253, so that toner images are formed. The toner images formed on the photoconductive drums 251 are transferred to the intermediate transfer belt 20 by the primary transfer rollers 254.

Meanwhile, a sheet 30 is taken onto the sheet transport path 37 from one of the first to third trays 31 to 33, for example, the first tray 31 by the pickup roller 34A and is separated by the separation roller 35A. Then, the sheet 30 is transported to a gap between the secondary transfer roller 26 and the intermediate transfer belt 20 by the registration rollers 36A, and the toner images transferred to the intermediate transfer belt 20 are transferred to the sheet 30.

After that, the toner images transferred to the sheet 30 are fixed by the fixing unit 27 and the sheet is discharged onto the discharge table 29 by the discharge rollers 28.

Other Exemplary Embodiments

Meanwhile, the invention is not limited to the above-mentioned exemplary embodiment, and may have various modifications without departing from the scope of the invention.

For example, the substrate 162 may come into contact with the restricting member 137 other than when the first and second connectors 191 and 192 are fitted to each other. Further, the above-mentioned distance D2 may be shorter than the distance D1 or the distance D3. Furthermore, the cable 18 may not be connected to the controller 17 and may be directly connected to the optical scanning device 250 of the image forming section 2.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical application, thereby enabling others skilled in the art to understand the invention for various embodiments and with the various modifications as are suited to the particular use contemplated. It is intended that the scope of the invention be defined by the following claims and their equivalents.

What is claimed is:

1. An image reader comprising:
a rectangular substrate;
a photoelectric conversion element that is mounted on one surface of the substrate and receives light reflected from a document;
a connector that is mounted on the other surface of the substrate so as to be closer to one end face of the substrate than a position on the substrate where the photoelectric conversion element is mounted, and is connected to a signal line through which information on an electrical signal converted by the photoelectric conversion element is sent;
a support member that supports the substrate at a position closer to the other end face of the substrate than the connector in a longitudinal direction of the substrate; and
a restricting member that is provided on the substrate so as to be closer to the one end face of the substrate in the longitudinal direction than the position where the substrate is supported by the support member, when another connector is fitted to the connector, the restricting member coming into contact with the one surface of the substrate and restricting the deformation of the substrate in a direction in which the another connector is fitted.

2. The image reader according to claim 1,
wherein the restricting member is not in contact with the one surface of the substrate before and after the another connector is fitted to the connector.

3. The image reader according to claim 1,
wherein the support member supports the substrate at a position closer to the photoelectric conversion element than the connector in the longitudinal direction of the substrate.

4. An image forming apparatus comprising:
an image reader including:
a rectangular substrate;
a photoelectric conversion element that is mounted on one surface of the substrate and receives light reflected from a document;
a connector that is mounted on the other surface of the substrate so as to be closer to one end face of the substrate than a position on the substrate where the photoelectric conversion element is mounted, and is connected to a signal line through which information on an electrical signal converted by the photoelectric conversion element is sent;
a support member that supports the substrate at a position closer to the other end face of the substrate than the connector in a longitudinal direction of the substrate; and
a restricting member that is provided on the substrate so as to be closer to the one end face of the substrate in the longitudinal direction than the position where the substrate is supported by the support member, when another connector is fitted to the connector, the restricting member coming into contact with the one surface of the substrate and restricting the deformation of the substrate in a direction in which the another connector is fitted; and
an image forming section that forms an image on a recording medium on the basis of information on an image read by the image reader.

5. The image forming apparatus according to claim 4, wherein the restricting member is not in contact with the one surface of the substrate before and after the another connector is fitted to the connector.

6. The image forming apparatus according to claim 4,
wherein the support member supports the substrate at a position closer to the photoelectric conversion element than the connector in the longitudinal direction of the substrate.

* * * * *